US007188043B1

(12) United States Patent
Wolf

(10) Patent No.: US 7,188,043 B1
(45) Date of Patent: Mar. 6, 2007

(54) BOUNDARY SCAN ANALYSIS

(75) Inventor: Mikhail A. Wolf, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/769,241

(22) Filed: Jan. 30, 2004

(51) Int. Cl.
*G01R 31/14* (2006.01)

(52) U.S. Cl. ...................... 702/117; 702/119

(58) Field of Classification Search ............... 702/117, 702/119, 120, 122, 123; 714/727; 716/12
See application file for complete search history.

(56) References Cited

U.S. PATENT DOCUMENTS

| | | | | |
|---|---|---|---|---|
| 5,497,378 A * | 3/1996 | Amini et al. | ................ | 714/727 |
| 5,517,637 A * | 5/1996 | Bruce et al. | .................. | 703/15 |
| 6,378,094 B1 * | 4/2002 | Chakraborty et al. | ....... | 714/727 |
| 6,449,755 B1 * | 9/2002 | Beausang et al. | ............... | 716/5 |
| 6,560,739 B1 * | 5/2003 | Chung | ........................ | 714/726 |
| 6,697,982 B2 * | 2/2004 | Chakravarthy et al. | ..... | 714/738 |
| 6,721,923 B2 * | 4/2004 | Fisher | ............................ | 716/1 |
| 6,938,236 B1 * | 8/2005 | Park et al. | ..................... | 716/17 |
| 6,941,243 B1 * | 9/2005 | Maciona et al. | ............ | 702/182 |
| 6,988,229 B1 * | 1/2006 | Folea, Jr. | ..................... | 714/727 |
| 7,073,111 B2 * | 7/2006 | Whetsel | ....................... | 714/727 |

* cited by examiner

*Primary Examiner*—Marc S. Hoff
*Assistant Examiner*—Anthony Gutierrez
(74) *Attorney, Agent, or Firm*—LeRoy D. Maunu

(57) ABSTRACT

A circuit testing approach involves the generation of boundary scan information using test vectors to identify characteristics of a circuit design and a boundary scan implementation therefor. According to an example embodiment of the present invention, test vectors are used in simulation to identify circuit design characteristics for establishing a boundary scan test program. The test vectors are generated using a netlist of the circuit design. The test vectors are used to simulate operation of the circuit, and responses to the simulation are detected and used to identify design-specific circuit characteristics and a boundary scan test program is generated using the design-specific circuit characteristics.

18 Claims, 4 Drawing Sheets

BOUNDARY SCAN ANALYSIS

FIELD OF THE INVENTION

The present invention generally relates to the generation of boundary scan description language (BSDL)-type files using circuit analysis, and more particularly to the analysis of boundary scan chain implementations.

BACKGROUND

The demand for high-speed, reliable electronic circuits and devices continues to grow at a rapid pace. Concurrently, the complexity of these circuits has also been increasing to meet the needs of a variety of applications. As the complexity and expense of these electronic circuits increases, the testing and analysis of the circuits for a variety of implementations also becomes increasingly important. In addition, accessing certain elements of these circuits has also become more difficult as the elements themselves are scaled smaller and as circuits are formed in increasingly dense arrangements.

Boundary scan analysis is one type of approach used for testing and analyzing circuits, and has been found particularly useful for applications where access to circuit elements for testing is limited. Boundary scan analysis is a methodology allowing controllability and observability of boundary pins of a Joint Test Access Group (JTAG) compatible device via software control. The analysis is typically implemented using the Institute of Electrical and Electronic Engineers (IEEE) standard 1149.1, known as the IEEE Standard Test Access Port and Boundary Scan Architecture. Circuits arranged for boundary-scan analysis typically employ built-in architecture, with pins located at the "boundary" of the circuit and accessible for passing test signals to and from the circuit. Inputs provided via the pins are coupled to various portions of the circuit, depending on the type of input. Outputs from the circuit are passed to external test circuitry via the pins.

The boundary-scan test architecture provides a means to test interconnects between integrated circuits on a board without necessarily using physical test probes, and can be implemented using a variety of circuits. In most applications, a boundary-scan cell that includes a multiplexer and latches is coupled to each pin on the device. These boundary-scan cells capture data from pin or core logic signals, or force data onto pins. Captured data is serially shifted out via the pins for analysis (e.g., externally compared to expected results). Forced test data is serially shifted into the boundary-scan cells via the data port input pins. The shifting and other boundary-scan operations are controlled, for example, using a serial data path (e.g., a scan path or scan chain).

By allowing direct access to nets, boundary-scan eliminates the need for large numbers of test vectors that are normally needed to properly initialize sequential logic. Tens or hundreds of vectors may do the job that had previously required thousands of vectors. Potential benefits realized from the use of boundary-scan are shorter test times, higher test coverage, increased diagnostic capability and lower capital equipment cost.

BSDL facilitates the description of testability features in components that comply with IEEE Standard 1149, discussed above. This language can be used by tools that make use of those testability features. With a BSDL description of a component and knowledge of IEEE Standard 1149, it is possible to describe data transport characteristics of a particular component that relate to the capture, shifting and updating of data in a particular IC.

While boundary scan analysis has been found very useful, certain aspects thereof have presented challenges. For example, boundary scan analysis relies on programming language (i.e., boundary scan description language (BSDL)) for operational instructions. However, in some applications, the construction of a correct BSDL file is difficult due to a large number of inputs and outputs and very specific device architecture. Approaches that have previously been used to construct BSDL have typically been unreliable insofar as they depend upon the correct interpretation of relevant device information. For instance, text editor approaches, BSDL editor approaches and synthesis methods that create BSDL files from computer aided engineering (CAE) design data have all exhibited suspect reliability. In addition, automatic analysis methods based upon specific register-transfer level (RTL) description of boundary scan chains or on unmodified or annotated schematics typically fail to address extended circuit features or complex cell designs.

The present invention may address one or more of the above issues.

SUMMARY OF THE INVENTION

Various aspects of the invention are directed to approaches for circuit analysis that address the above-discussed challenges related to BSDL generation and others, in some instances bypassing previous error-prone techniques.

In one example embodiment of the present invention, a boundary scan analysis approach involves the determination of various characteristics of a circuit design using the results of test vector simulation. The determined characteristics are then used to generate a comprehensive boundary scan test for the circuit design. With this approach, characteristics of specific circuit designs such as input and output pin connectivity and specific device architecture are readily identified, addressing challenges including those discussed above. In addition, this approach is applicable to both simulated designs and to actual circuits implemented with the circuit design characteristics.

In a more particular example embodiment of the present invention, a general schematic of the circuit design is used to generate an initial set of test vectors. The initial test vectors are applied to boundary scan inputs of the design and a response of the device is detected at boundary scan cells thereof. The response is then used with the general schematic to determine specific characteristics of the circuit design (e.g., extended features or complex designs not available from the general schematic). The specific characteristics are then used to generate more comprehensive test vectors that are applied to the design, with an output response of the device again detected. This process is repeated until sufficient information is collected to describe the Boundary Scan transport characteristics of the circuit design to enable the creation of a testing approach for verifying the design, for instance, by creating a boundary scan description language (BSDL) file.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings in which.

DETAILED DESCRIPTION

The present invention is believed to be applicable to a variety of different circuit analysis approaches and implementations, some of which are described herein. Those skilled in the art will appreciate that various aspects of the invention could also apply to a variety of other circuits and testing approaches.

According to an example embodiment of the present invention, specific characteristics of an electronic circuit used to generate BSDL files are detected using a boundary scan test vector simulation created from a general design schematic of the circuit. Responses (outputs) of the circuit to the test vector simulation are detected and used to identify specific features of the circuit that vary from the general design schematic. For instance, by monitoring output pins of the circuit, a response of the circuit can be mapped to input signals applied to boundary scan chain cells. Circuit paths, schematic net arrangements and other characteristics of the circuit can thus be identified. As these characteristics are identified, increasingly comprehensive test vectors are generated and used to simulate the design, with corresponding outputs from the simulated design being detected and used to further identify characteristics of the design. Once a sufficiently complete identification of the circuit and a boundary scan chain implementation is obtained, a final test file (e.g., a BSDL file) is created for boundary-scan analysis of the circuit.

Figure 1:
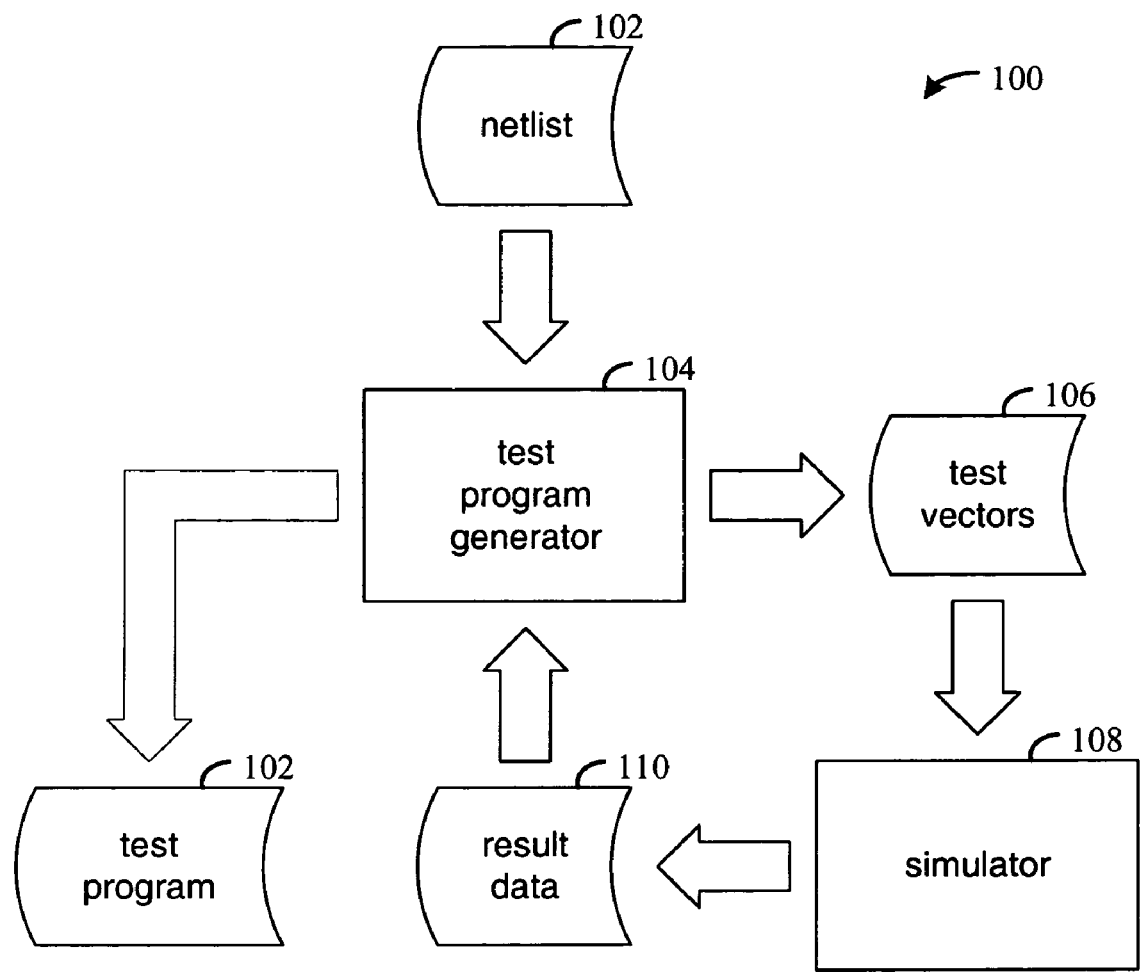
FIG. 1 shows a block diagram of an approach for extracting boundary scan chain information from a design, according to an example embodiment of the present invention.

FIG. 1 shows a system 100 for generating a test program for a particular circuit design, according to another example embodiment of the present invention. A test program generator 104 parses a netlist 102 to determine architecture characteristics (e.g., type, name and direction of ports) of the design to be tested. Using the architecture characteristics, the test program generator 104 generates test vectors 106 that are applied to a simulator 108 (i.e., an appropriately programmed computer) that simulates a particular design to which the netlist applies. The test program generator 104 identifies characteristics of the particular design and boundary scan cells thereof as a function of result data 110 generated by the simulator 108 in response to the test vectors 106. For instance, when test vectors selected for generating a reaction from a particular type of circuit element result in an expected response, the circuit element is mapped to an appropriate boundary scan cell or a pin.

The identified characteristics are used with the original netlist 102 to generate new test vectors 106, which are applied to the simulator 108 to generate result data 110 with the new test vectors. The process of applying test vectors and using result data to generate new test vectors is repeated in this manner until selected completion criteria are met for establishing a test program 102. The selected completion criteria may be met, for example, when sufficient information about a boundary scan implementation involving boundary scan cells for the circuit is identified such that a unique test program can be written.

In one implementation, a physical circuit is used in place of the simulator 108 discussed above in connection with FIG. 1. The physical circuit employs circuitry characterized by the netlist 102. The test program generator 104 is connected to boundary scan access ports and pins of the physical circuit to respectively apply the test vectors 106 and detect the result data 110. After sufficient information about the boundary scan implementation of the physical circuit is extracted, the test program generator 104 uses the extracted information and the netlist to create the test program 102 for analyzing the physical circuit.

Figure 2:
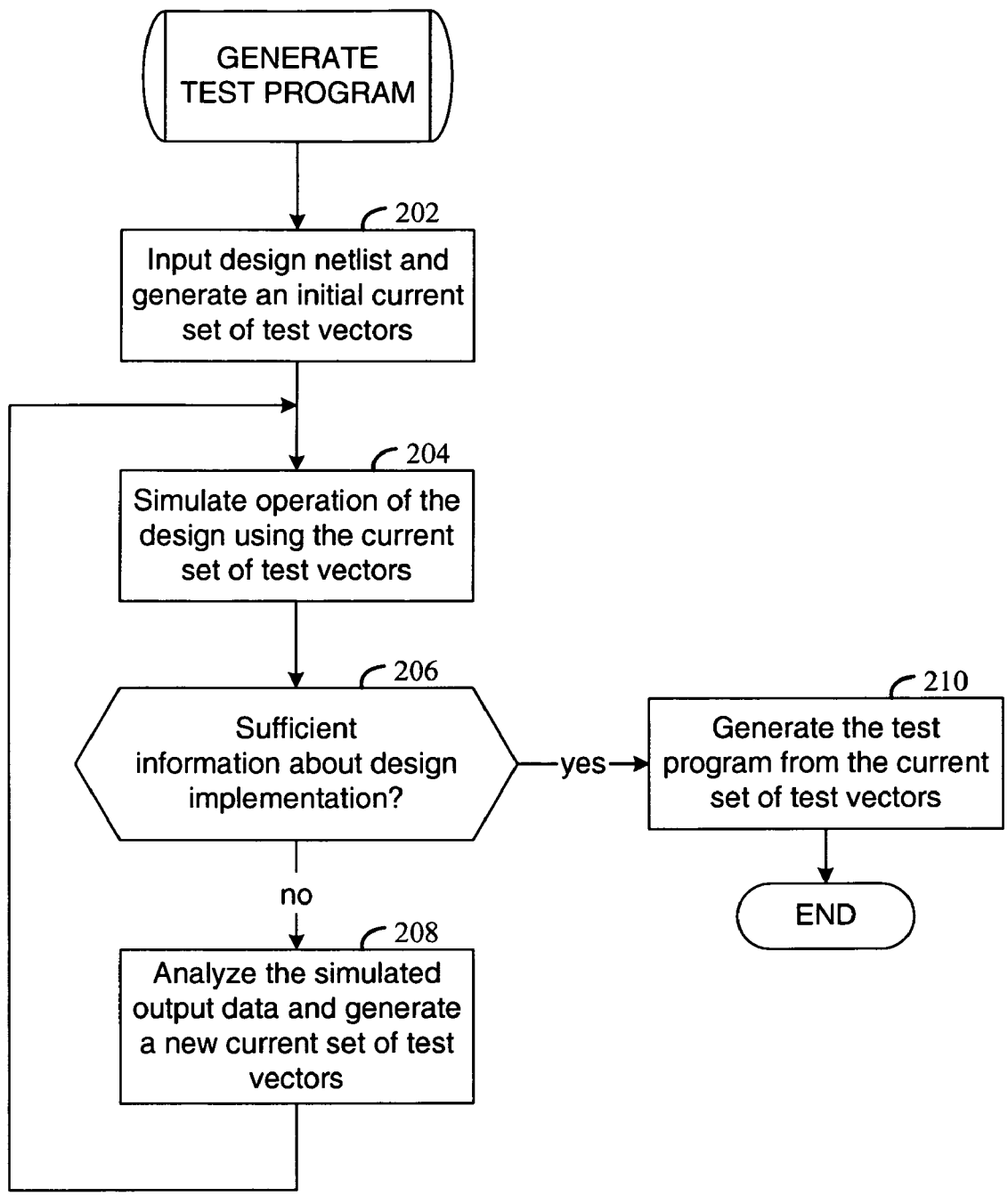
FIG. 2 is a flow diagram for an approach to boundary scan analysis, according to another example embodiment of the present invention.

FIG. 2 shows a flow diagram for generating a test program for a circuit design, according to another example embodiment of the present invention. The approaches shown and discussed in connection with FIG. 2 below are applicable, for example, with the implementations shown and discussed in connection with FIG. 1 above. At block 202, a design netlist is input and used to generate an initial current set of test vectors. The operation of the design is simulated at block 204 using the current set of test vectors to generate an output, and the output is used to determine information (e.g., circuit characteristics) about the design. If sufficient information about the design has been determined at block 206, the test program is generated from the current set of test vectors at block 210.

If sufficient information about the design has not been determined at block 206, the simulated output is analyzed and used to generate a new current set of test vectors. The new current set of test vectors takes into consideration the determined information and is selected for generating an output from the design to identify further information. The process resumes at block 204 and is repeated until sufficient information for generating the test program is determined.

Figure 3:
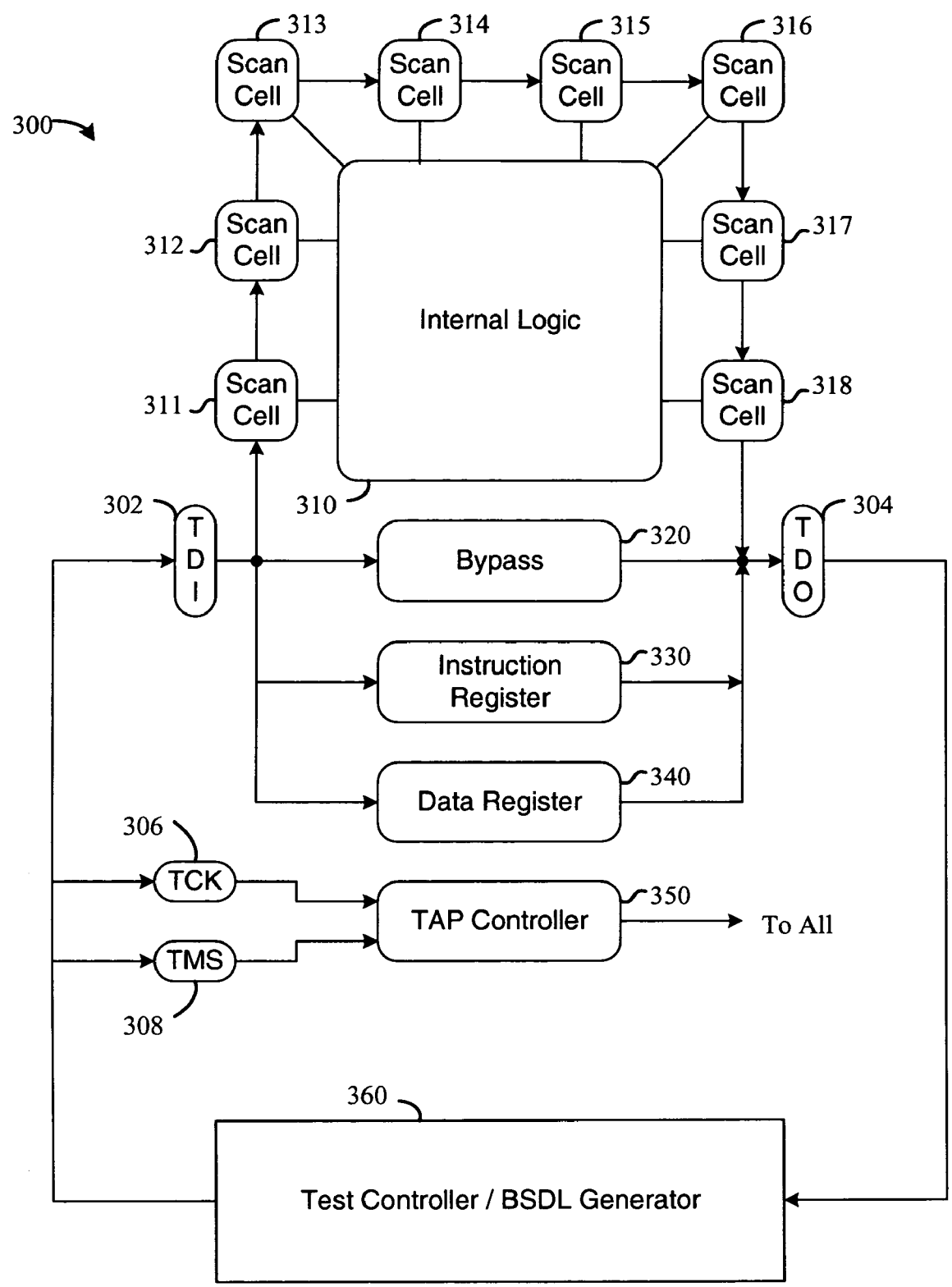
FIG. 3 shows an arrangement for boundary scan analysis, according to another example embodiment of the present invention.

FIG. 3 shows a test controller/generator 360 used in identifying characteristics of a boundary-scan compatible circuit 300 and establishing a boundary-scan description language file, according to another example embodiment of the present invention. The test controller/generator 360 may, for example, be implemented using one or more of the approaches discussed herein, for example as described below in connection with FIG. 4. In addition, the test controller/generator 360 and the functions it performs may, for example, involve two or more separate units.

The circuit 300 includes internal logic 310 with boundary-scan cells 311–318 coupled thereto. A boundary scan portion of the circuit 300 includes a bypass circuit 320, instruction register 330, data register 340 and TAP controller 350. Test data input (TDI) node 302 receives test inputs and test data output (TDO) node 304 outputs test data. TDI node 302 and TDO node 304 may, for instance, include a plurality of input or output pins, respectively. Test clock (TCK) node 306 and test mode select (TMS) node 308 respectively receive clock and mode signals from the test controller/generator 360. The bypass circuit 320 selectively bypasses input signals received at TDI node 302 directly to the TDO node 304 and, for example, to other circuits similar to and coupled in series with the circuit 300. A bypass instruction from the test controller/generator 360 allows the circuit 300 to remain in a functional mode while passing data to another circuit to be tested. Optionally, one or more of the circuit components (e.g., TAP controller 350 or instruction register 330) are part of the test controller/generator 360.

The operation of the boundary-scan cells 311–318 is controlled with the TAP controller 350 and the instruction register 330, with the optional use of one or more data registers 340 for various test functions. Under normal operating conditions, the boundary scan cells 311–318 are inactive an allow data to pass to the internal logic 310. Under test conditions, the boundary scan cells 311–318 are active and used to capture response data from the internal logic 310 to test input vectors.

The test controller/generator 360 uses a netlist to generate an initial set of test vectors and applies them to the circuit 300. The test controller/generator 360 uses responses from the circuit 300 to identify characteristics of the circuit that are then used for establishing more comprehensive test vectors (i.e., test vectors utilizing aspects of the identified characteristics). The comprehensive test vectors are then applied to the circuit 300, with responses from the circuit again being used to identify additional characteristics of the circuit. This process of applying test vectors and identifying characteristics of the circuit is repeated until sufficient information about the circuit 300 is identified for establishing a boundary scan program.

Figure 4:
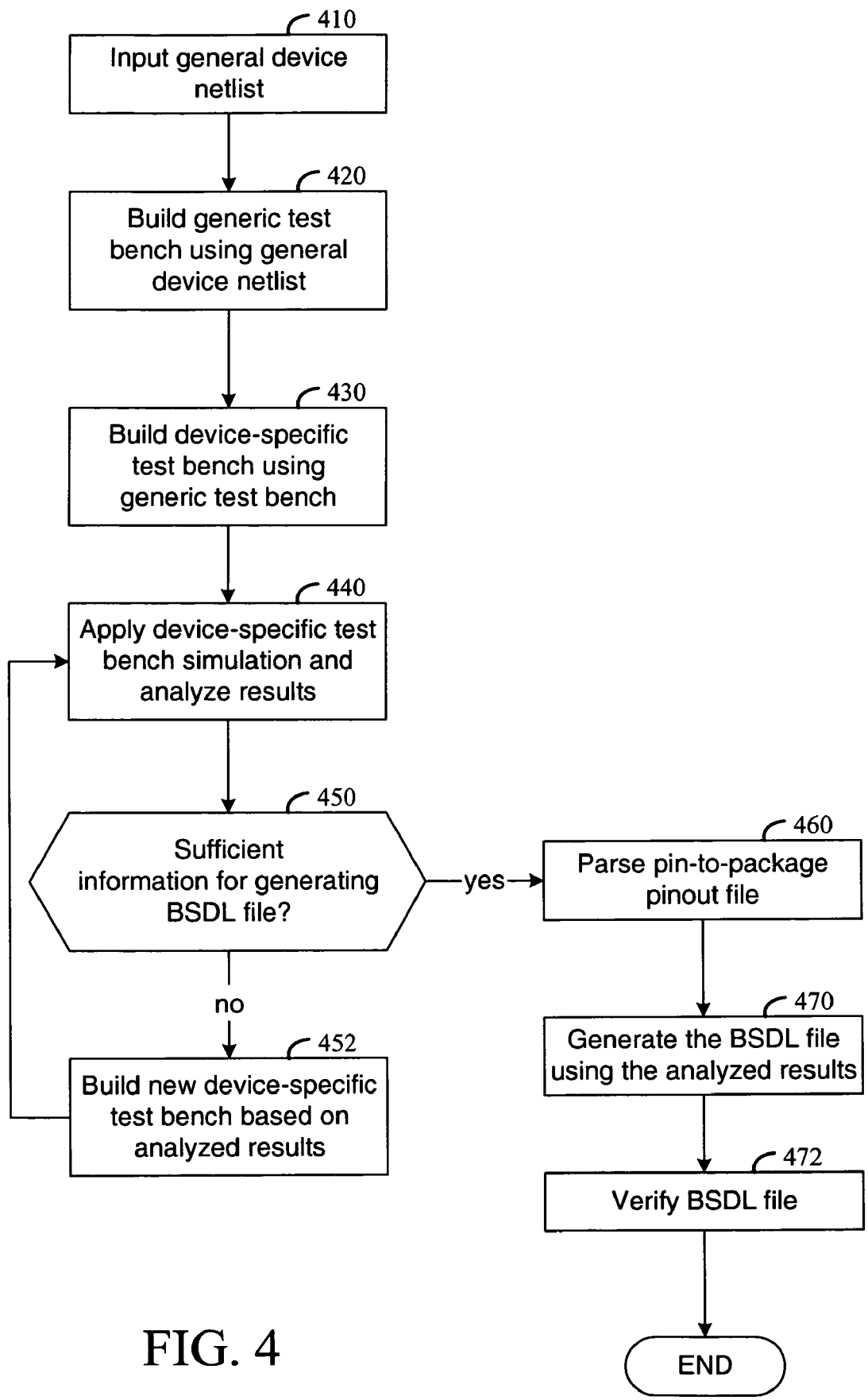
FIG. 4 shows is another flow diagram showing an approach for establishing boundary scan description language for a device, according to another example embodiment of the present invention.

FIG. 4 shows an approach for generating a BSDL file using a general design netlist and test vector simulation to identify specific characteristics of a circuit design, according to another example embodiment of the present invention. The approach shown in FIG. 4 may be applicable, for example, to the circuit 300 shown in FIG. 3. In this regard, reference to selected elements of the circuit 300 is made below.

At block 410, a general device netlist is analyzed to determine general circuit characteristics, such as the number of input/output (I/O) pins, top level pins and pads, and the logic level of particular states. At block 420, a generic test bench is built using the device netlist. The generic test bench involves identifying characteristics such as register existence and/or length (e.g., for instruction, boundary scan, bypass or data registers) and selecting a correct register for particular instructions. For instance, referring to FIG. 3, various characteristics related to the bypass circuit 320, instruction register 330 and data register 340 can be identified at block 420. A device-specific test bench specific to the circuit design for which characteristics are being identified is then built at block 430 using the generic test bench. The device-specific test bench is then applied to the circuit design at block 440, with results being analyzed to determine information about the circuit design.

Using the circuit arrangement shown in FIG. 3 as an example, the following describes an approach for generating information to be analyzed at block 440 with the device-specific test bench simulation. Sample/preload and EXTEST instruction operations are carried out (with the instructions involving testing for the IEEE 1149.1 standard, discussed above). Typical sample/preload instructions set the device being analyzed in a functional mode and connect a boundary scan register (e.g., data register 340) between input (e.g., TDI 302) and output (e.g., TDO 304) nodes. During sample/preload instruction, the boundary scan register can be accessed to take a sample of functional data entering and leaving the device being analyzed, and to preload test data into the boundary scan register. Typical EXTEST instructions involve setting an external boundary test mode, connecting boundary scan register(s) between input (e.g., TDI 302) and output (e.g., TDO 304) nodes and loading boundary scan cells (e.g., cells 311–318) with test patterns. In addition, input boundary cells are mapped to I/O pins and to particular input instructions, and control and output cells are mapped to I/Os. The correct operation of scan cells and I/O pin connections is also verified (or identified as being incorrect).

The above-discussed and other results are analyzed at block 440 and characteristics of the circuit design are identified therefrom. If information about the circuit design sufficient for generating a BSDL file is not available at block 450, a new device-specific test bench is built at block 452. The process of analysis and identification of circuit characteristics then resumes at block 440 with the new device-specific test bench, with new test vectors being applied to the circuit design. If sufficient information for generating the BSDL file is available at block 450, a pin-to-package pinout file for the circuit design is parsed at block 460 and a BSDL file is generated using the analyzed results at block 470.

The BSDL file may then be verified for correctness at block 472. The correctness of the BSDL file may be determined by way of syntax verification and test vector generation, which may be performed by a test service vendor, for example. JTAG test vectors may be used in device simulation or directly applied to a device on a tester (not shown). Test vectors may be used to detect timing or synthesis errors.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of circuit approaches, and has been found to be particularly applicable and beneficial in circuit analysis involving boundary-scan type signals. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for generating a boundary scan test program for an integrated circuit design employing a boundary scan implementation, the method comprising:

determining, from a netlist that describes the integrated circuit design, design information including the design architecture and type, name and direction of input and output ports used by the design;

generating, without use of any boundary scan test program, a current set of test vectors from the design information;

simulating the operation of the design using the current set of test vectors and storing result data output during the simulation;

generating a new current set of test vectors as a function of the result data;

repeating the steps of simulating, storing result data and generating a new current set of test vectors until selected completion criteria are satisfied; and in response to and after the selected completion criteria being satisfied, determining the boundary scan implementation from the result data and creating the boundary scan test program from the result data.

2. The method of claim 1, wherein storing result data includes storing result data indicative of characteristics of the design and the boundary scan implementation and wherein repeating the steps of simulating, storing result data and generating a new current set of test vectors until selected completion criteria are satisfied includes repeating the steps until sufficient characteristics of the design and boundary scan implementation are determined to generate the boundary scan test program.

3. The method of claim 2, further comprising using the stored result data to determine circuit connectivity in the design and boundary scan implementation and repeating the steps of simulating, storing result data and using the stored result data to determine circuit connectivity until sufficient circuit connectivity characteristics of the design and boundary scan implementation are determined.

4. The method of claim 3, wherein using the stored result data to determine circuit connectivity includes using the stored result data to map input boundary cells to boundary scan access ports.

5. The method of claim 4, further comprising using the stored result data to map input boundary cells to a particular type of input instruction.

6. The method of claim 3, wherein using the stored result data to determine circuit connectivity includes using the stored result data to map output boundary cells to boundary scan access ports.

7. The method of claim 3, wherein using the stored result data to determine circuit connectivity includes using the stored result data to map control circuits to boundary scan access ports.

8. The method of claim 2, further comprising using the stored result data to determine circuit elements of the design and boundary scan implementation and repeating the steps of simulating, storing result data and using the stored result data to determine circuit elements of the design and boundary scan implementation until sufficient circuit element characteristics of the design and boundary scan implementation are determined.

9. The method of claim 8, wherein using the stored result data to determine circuit elements includes using the stored result data to map the circuit elements to boundary scan access ports.

10. The method of claim 1, wherein generating a new current set of test vectors includes generating verilog test vectors.

11. The method of claim 1, wherein generating a new set of test vectors includes generating new test vectors that are more comprehensive than the current test vectors.

12. The method of claim 1, further comprising using the result data to identify circuit characteristics of the design and boundary scan implementation, wherein generating a new current set of test vectors includes generating new test vectors that use the identified circuit characteristics.

13. For use with an integrated circuit design having test input/output (I/O) ports, a plurality of interconnects coupled to the test I/O ports and a boundary scan implementation therefor, a testing system comprising:
 a test controller programmed to determine, from a netlist that describes the integrated circuit design, design information including the design architecture and type, name and direction of the I/O ports, the test controller further adapted to generate, without use of any boundary scan test program, a current set of test vectors from the design information for simulating the operation of the design and the boundary scan implementation;
 a storage circuit adapted to store result data output during the simulation, the test controller being further adapted to generate a new current set of test vectors as a function of the result data and to repeat the steps of simulating, storing result data and generating a new current set of test vectors until selected completion criteria are satisfied; and
 a test program generator adapted to determine the boundary scan implementation from the result data and create, in response to and after the selected completion criteria being satisfied, a boundary scan test program from the result data.

14. The testing system of claim 13, wherein the test controller is a computer programmed to simulate the operation of the integrated circuit design and boundary scan implementation thereof in response to the test vectors.

15. The testing system of claim 13, wherein the integrated circuit design includes a plurality of boundary scan cells coupled to the I/O ports and wherein the test controller is coupled to apply the test vectors to the I/O ports via the boundary scan cells and wherein the storage circuit receives the result data output via the boundary scan cells.

16. The testing system of claim 15, wherein the storage circuit is adapted to store result data output during the simulation that is indicative of the connectivity of the boundary scan cells to the I/O ports and to generate the new current set of test vectors as a function of the indicated connectivity of the boundary scan cells to the I/O ports.

17. The testing system of claim 15, wherein the integrated circuit design includes at least two distinct circuits, each distinct circuit having test I/O ports and associated boundary scan cells coupled thereto, the plurality of boundary scan cells being coupled in a chain with output boundary scan cells from a first one of the at least two distinct circuits being coupled to input boundary scan cells of a second one of the at least two distinct circuits, wherein the storage circuit is adapted to store result data indicative of the chain connectivity of the output boundary scan cells to the input boundary scan cells and wherein the test program generator is adapted to create the boundary scan as a function of the chain connectivity.

18. A boundary scan description language (BSDL) file generator comprising:
 a netlister tool adapted to netlist a circuit design having a boundary scan implementation;
 a test vector generator adapted to parse a circuit design netlisted by the netlister tool to determine the type, name and direction of ports used by the design and to generate an initial set of test vectors without use of any BSDL file;
 an analyzer adapted to analyze outputs of the circuit design in response to the test vectors and to determine characteristics of the circuit design;
 the test vector generator being further adapted to use the determined characteristics to generate new comprehensive test vectors the analyzer being further adapted to analyze outputs of the circuit design in response to the new comprehensive test vectors; and
 a program generator adapted to use the analyzed outputs to create the BSDL file for the circuit design after analyzing the outputs of the circuit design.

* * * * *